US006552541B2

(12) United States Patent
Nauerth

(10) Patent No.: US 6,552,541 B2
(45) Date of Patent: Apr. 22, 2003

(54) METHOD OF CORRECTING DISTURBING INFLUENCES ON THE MR SIGNALS OF A SUBSTANCE DISPOSED IN THE MEASURING VOLUME OF AN MR APPARATUS

(75) Inventor: Arno Nauerth, Erlenbach (DE)

(73) Assignee: Bruker Biospin MRI GmbH, Ettlingen (DE)

( * ) Notice: Subject to any disclaimer, the term of this patent is extended or adjusted under 35 U.S.C. 154(b) by 86 days.

(21) Appl. No.: 09/849,361

(22) Filed: May 7, 2001

(65) Prior Publication Data

US 2002/0003422 A1 Jan. 10, 2002

(30) Foreign Application Priority Data

Jul. 4, 2000 (DE) .......................... 100 32 345

(51) Int. Cl.[7] .................................. G01V 3/00
(52) U.S. Cl. ........................ 324/309; 324/307
(58) Field of Search .................. 324/309, 307, 324/306, 312, 314, 300

(56) References Cited

U.S. PATENT DOCUMENTS

| 4,698,591 | A | | 10/1987 | Glover | |
| 4,706,027 | A | | 11/1987 | Hughes | |
| 4,885,549 | A | * | 12/1989 | Thrift et al. | 324/300 |
| 5,302,899 | A | | 4/1994 | Schett | |
| 5,548,215 | A | * | 8/1996 | Kohno et al. | 324/307 |
| 6,275,720 | B1 | * | 8/2001 | Du et al. | 324/307 |

FOREIGN PATENT DOCUMENTS

| DE | 23 52 315 | 4/1975 |
| DE | 36 85 947 | 2/1983 |

* cited by examiner

Primary Examiner—Louis Arana
(74) Attorney, Agent, or Firm—Paul Vincent

(57) ABSTRACT

A method of correcting disturbing influences on MR (=magnetic resonance) signals of a substance disposed in the measuring volume of an MR apparatus excited by one or more RF (=radio frequency) excitation pulses, wherein an RF excitation pulse is irradiated onto the substance and a time-dependent MR signal generated thereby is detected and digitized in a phase-sensitive fashion, wherein a time dependence (1)$\Delta\phi_i(t_i)$ of the phase of an MR signal, relative to a predetermined reference phase $\phi_{ref,i}(t_i)$ of a reference signal $S_{ref,i}(t_i)$, is determined and digitized from a time dependence (1) $s_i(t_i)$ of the detected and digitized MR signal and one or more correction or controlled variables are determined therefrom. Nearly all measuring points are used for determination of the magnetic field deviation and thus for control to guarantee considerably improved control accuracy.

31 Claims, 10 Drawing Sheets

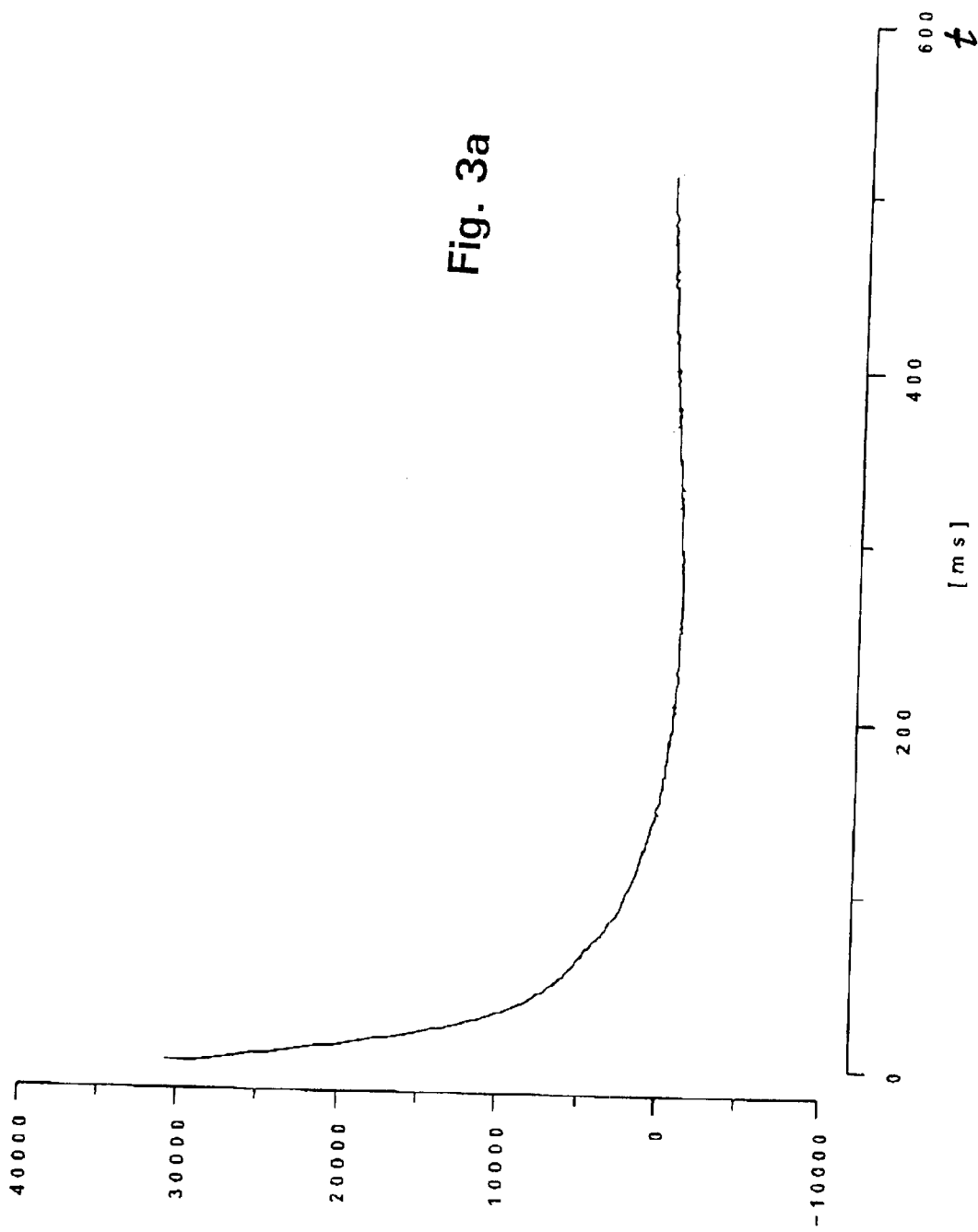

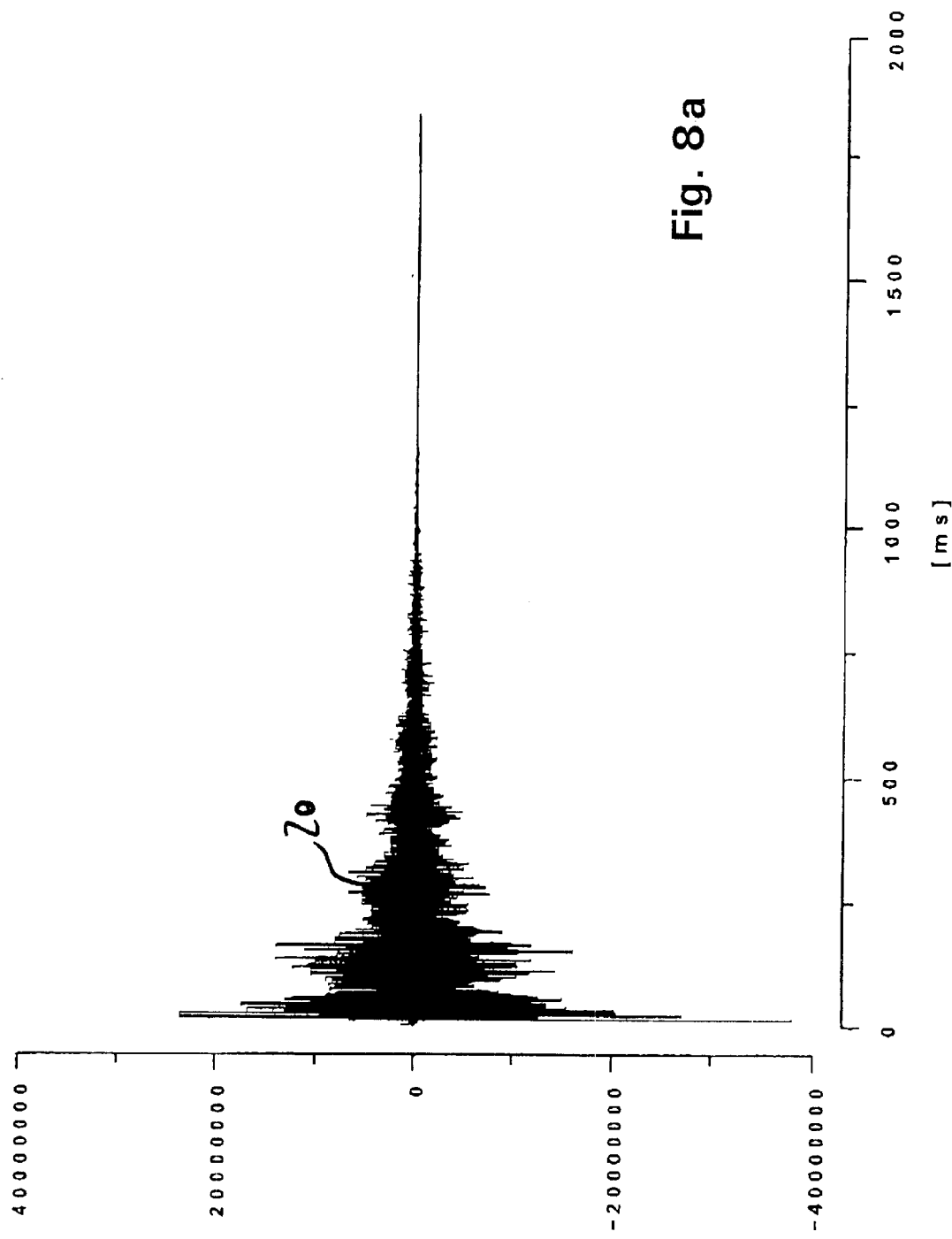

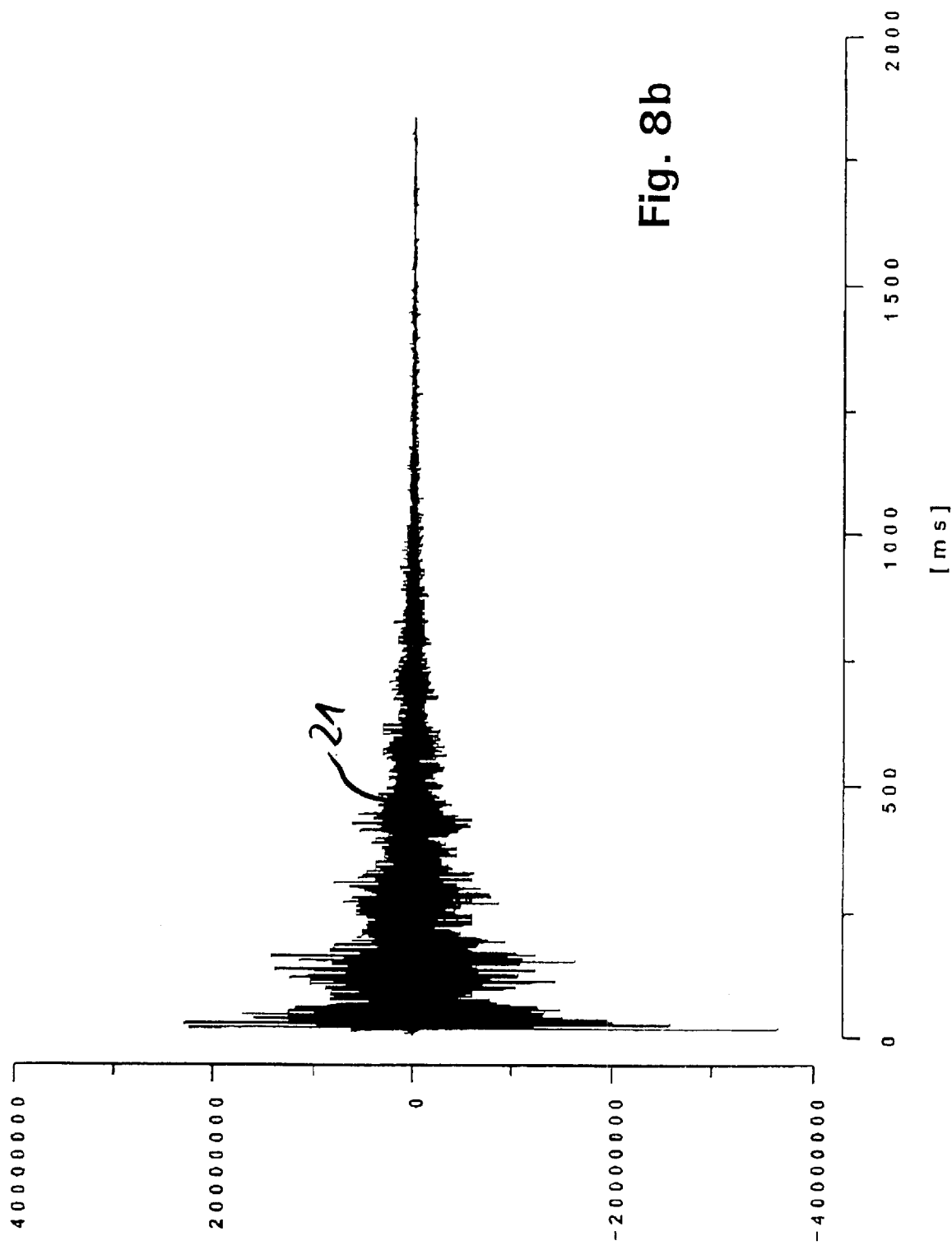

METHOD OF CORRECTING DISTURBING INFLUENCES ON THE MR SIGNALS OF A SUBSTANCE DISPOSED IN THE MEASURING VOLUME OF AN MR APPARATUS

This application claims Paris Convention priority of DE 100 32 345.6 filed Jul. 4, 2000 the entire disclosure of which is hereby incorporated by reference.

BACKROUND OF THE INVENTION

The invention concerns a method of correcting disturbing influences on the MR (=magnetic resonance) signals of a substance disposed in the measuring volume of an MR apparatus excited by one or several RF (=radio frequency) excitation pulses, wherein an RF excitation pulse is irradiated onto the substance and a time-dependent MR signal produced thereby is detected and digitized in a phase-sensitive fashion.

A method of this type is disclosed e.g. by DT 23 52 315 C2 and EP 0 522 191 A1.

MR field stabilization should be as accurate as possible to keep the magnetic field as constant as possible. Towards this end, both small interfering amplitudes which produce small frequency changes as well as relatively large external magnetic interfering amplitudes should be compensated. Field instabilities have a disturbing effect, in particular, for prolonged experiments which can take several hours. Even with the most modern superconducting magnets, the magnetic field changes with time due to a very small but important electrical resistance of the coil itself and due to external influences, such as the surrounding temperature.

To compensate for field inhomogeneities, an MR signal is conventionally used as a reference in a control circuit, wherein the shape of the dispersion signal is utilized. The amplitude in the center of the signal is zero and that amplitude is non-zero on both sides of the center. Most importantly, the sign of the signal changes during passage through resonance. If the initially detected signal is detected exactly on resonance and the magnetic field then changes, a signal is produced in a detector. The sign of the signal indicates the direction of change of the magnetic field. In a superconducting magnet, the so-called lock signal is amplified and fed to a coil which produces a magnetic field to either increase or decrease the main magnetic field. In an electromagnet, the lock signal controls the current supplied to the magnet. This method is relatively inaccurate since only a small portion of the signal is used to control the magnetic field. Exact determination of the passage of the signal through resonance is also difficult.

DT 23 52 315 C2 discloses a method of stabilizing the relationship between measuring frequency and magnetic field strength in a spin resonance spectrometer. The spin resonances of a standard substance introduced into the magnetic field of the spin resonance spectrometer are excited by RF pulses having a dense frequency spectrum. The frequency of the resonance signal of the standard substance, contained in the pulse response signal, is determined and compared with a reference frequency. The determined deviation provides a controlled variable for adjusting the magnetic field strength or the measuring frequency, with the frequency of the resonance signal of the standard substance being determined through Fourier analysis of the pulse response signal. The spin resonances of the standard substance are adjusted, after sufficient approximation of the relationship between measuring frequency and magnetic field strength, to the desired relationship using a continuous-wave signal to produce a suitable resonance signal for the standard substance. Such a pulsed control is very slow and therefore inaccurate.

EP 0 522 191 A1 discloses a method of compensating time-dependent field disturbances in magnetic fields of electromagnets having high field homogeneity. In particular, a dispersion nuclear signal $u_x$ of a comparative substance, located in the sample region of the superconducting electromagnet within which the magnetic resonance is measured, is recorded and used for compensation by producing a current in a field correction coil of the electromagnet in dependence on the dispersion signal. The absorption signal $u_y$ of the comparative substance is also recorded and compensation is carried out in dependence on the variable $u_x/u_y$ and/or $(1/u_y)(du_x/dt)$. This prior art method is also too slow for field stabilization required for a prolonged experiment.

It is therefore the underlying purpose of the present invention to realize a method for faster and more exact control, i.e. a method which decreases the sampling time and increases control sensitivity.

SUMMARY OF THE INVENTION

This object is achieved in accordance with the invention in a simple but effective fashion in that a time dependence $s_i(t_i)$ of the detected and digitized MR signal is used to determine a time dependence $\Delta\phi_i(t_i)$ of the phase of the MR signal relative to a predetermined reference phase $\phi_{ref}(t_i)$ of a reference signal $s_{ref}(t_i)$. The determined phase is then digitized and one or more correction or control values are determined therefrom.

In the inventive method, the phase dependence is the actually relevant variable for a deviation of the magnetic field from the desired value. In prior art, most of the measuring points play no or only a subordinate role in determining the magnetic field deviation. However, the values of a free induction decay (FID) at later times of the FID are of particular interest for control and correction. Advantageously, in the inventive method, nearly all measuring points are used for determination of the magnetic field deviation and thus for control. This guarantees considerably improved control accuracy and furthermore permits faster repetition with less measuring points for equal or improved control quality. Control is possible with means which are already present in an MR apparatus. Additional electronic equipment for controlling the frequency or the magnetic field is not required.

In a particularly preferred variant, the average slope of the phase of the MR control signal, relative to the reference phase, is determined by means of a linear regression through the corresponding time function $\Delta\phi_i(t_i)$. The use of a straight line permits estimation of a previous frequency deviation, wherein the influence of noise on the estimate is suppressed by the straight line fit.

Another variant is characterized in that a curvature of the time function $\Delta\phi_i(t_i)$ is determined and used for predicting the probable behavior of the system with respect to nominal deviations in the immediate future. Determination of the curvature further improves the control or correction since extrapolation permits prediction of the deviation from the ideal case, thereby producing adaptive and more accurate control.

In a further development, the curvature of the time function $\Delta\phi_i(t_i)$ is determined by means of a polynomial fit of higher order. A polynomial fit permits particularly accurate approximation of the time function. Accurate determination of the actual frequency is thus possible. This is particularly important at the end of an FID.

A further method variant is characterized in that the contributions to the correction or controlled variable at different times $t_i$ from individual measuring points of the phase $\Delta\phi_i$, relative to the reference phase, are weighted in dependence on the signal-to-noise-ratio. Stronger weighting of low-noise increases the control accuracy. It is, however, also feasible to weight in dependence on the signal amplitude. Signals having a large amplitude are thereby used to a larger extent for determination of the controlled or correction variable than are signals having smaller amplitudes.

In a further method variant, RF excitation pulses are irradiated onto the substance in the measuring volume at pulse angles of $\alpha<<90°$. This approach does not require waiting for establishment of an equilibrium to permit rapid determination of the controlled variables and high repetition rates, thereby increasing the speed of the method.

If the frequency of the reference signal is chosen to be different than the desired frequency and if this preferably constant deviation is taken into consideration for determining the controlled or correction variable, summing up of residual signals from previous excitations is prevented.

It is particularly preferred to subject the detected MR signal to a digital filtration, preferably a bandpass filtration, which eliminates high-frequency and low-frequency disturbances and permits more accurate determination of the controlled or correction variable.

A method variant is characterized in that deviations of the magnetic field from a desired value are corrected or readjusted by means of the correction or controlled variable to stabilize the magnetic field in the measuring volume of the MR apparatus. In this fashion, as in prior art, the correct physical variable is controlled, however, with different correction variables. Control is thereby simplified. When the magnetic field is controlled, the measured frequencies remain almost constant.

In a particularly preferred method variant, all frequencies of the MR apparatus used for signal extraction, including the excitation frequency, are corrected or readjusted by means of the correction or controlled variable. In this case, the frequencies which are used for signal excitation or detection are tracked. The magnetic field can therefore take its course. The systematic error which occurs by controlling the frequencies and not the magnetic field, can be neglected. Since the magnetic field must not be controlled, one coil can be omitted in the MR apparatus. This operation with one less coil reduces energy requirements.

In a preferred variant of the inventive method, the method steps are repeated several times, preferably periodically with one frequency deviation Afi being determined for each repetition as the instantaneous controlled variable. In this fashion, it is possible to control the magnetic field for the duration of the repetitions, i.e. the magnetic field is continuously controlled.

In a particularly preferred variant of the method, the time dependence of the frequency deviation $\Delta f_i(t_i)$ for all measuring points is determined at the various times ti from $\Delta f(t)=[\Delta\phi_i(t_i)-\Delta\phi_i(0)]/t_i$. These values can be used to predict the future frequency deviations and the controlled or correction variable can be correspondingly determined.

A further development consists in that the controlled variable is determined from the frequency deviations of all measuring points as an average value $<\Delta f_i>$. Averaging of the frequency deviations produces a relatively precise controlled variable which is easy to use. Determination of this controlled variable is simple, which permits faster control.

In one embodiment, the substance disposed in the measuring volume of the MR apparatus comprises a sample substance and a control substance. A suitable control substance has only a few dominant lines. These sharp lines permit exact control, which would not necessarily be the case if control had to be carried out with the sample substance which may comprise several poorly defined frequency components. Superposition of frequency components causes large variations in the frequency amplitudes which could produce calculation errors in determining the frequencies. This would be a problem, in particular, when comparing successive scans. However, using the sample substance alone has considerable advantages in many cases.

A further embodiment of the inventive method is characterized in that, for correcting disturbances during detection and digitization of the MR signal of the sample substance, the MR signal of the control substance is detected and digitized at the same time as the MR signal of the sample substance is detected, and a time dependence $\Delta\phi(t)$ of the phase of the MR signal of the control substance, relative to the phase $\phi_{ref}$ of a predetermined reference signal, is determined from the time dependence s(t) of the MR signal of the control substance, and for each digitized point the detected MR signal of the sample substance is readjusted according to the phase $\Delta\phi(t)$, while taking into consideration the gyromagnetic ratio of sample substance and control substance. Since the control signal is recorded at the same time as the sample signal, it is possible to correct frequency shifts within a scan as well as the frequency and phase position. In contrast to prior art, correction occurs synchronously. A distorted signal can therefore be measured and subsequently be precisely corrected. Moreover, the phase can be corrected at each recorded point, in particular, before the start of the next excitation.

In a preferred further development of the inventive method, the time dependence $\Delta\phi(t)$ of the phase of the detected MR signal of the control substance, relative to the phase of the reference signal, is subjected to a smoothing process before readjustment of the MR signal of the sample substance. This suppresses noise and improves the quality of the control or correction process.

In a further variant for correcting disturbances occurring in an MR signal recording sequence with which the magnetic fields are systematically varied and with which certain magnetic field configurations are successively repeated in the measuring volume during the MR recording sequence, the MR signal of the control substance is excited and detected while one or more of these magnetic field configurations is present in the measuring volume. The control signals are produced at times when the magnetic field of the MR apparatus changes in a directed or intentionally equivalent fashion. Whereas prior art requires switching off control of the magnetic field (lock) or of the frequency for directed magnetic field changes, this measure permits control of the frequency for variable magnetic fields.

In particular for measuring sequences of in-vivo measurements not having a control substance, a sample signal can be measured and evaluated in accordance with the invention at similar repetitive time intervals, preferably between excitation of the measuring sample signal and its first phase encoding. In this manner, the frequency of the useful signal (usually an echo) can be corrected following the measuring sequence and/or the drift of the magnetic field $B_0$. It is possible to produce one additional control signal at each selected point of the sequence.

In a further development of the method, the MR recording sequence is sorted in accordance with successive scan regions with comparable properties and corresponding signal points are compared for correcting disturbances. Since only similar signals are compared, this is only possible when the overall sequence is repeated.

In an alternative further development, the predetermined reference signals are taken from a reference scan, in particular, from the first scan of the MR recording sequence. Instead of theoretical generation of the reference signals, which is almost impossible with systematic variation of the magnetic fields, the reference points for correction of disturbances are produced in a reference scan.

In a preferred fashion, the reference scan is selected such that the phase change is as small as possible with respect to preceding and following scans. If the phase change is relatively small with respect to neighboring scans, one can assume that the phase change is also small at the time at which the reference scan is recorded. The reference scan is thereby selected at a favorable point in time to permit exact control.

It is particularly advantageous to predetermine and fixedly program the reference signals for a certain MR recording sequence. The recording sequences are often repeated. Once a good reference scan has been found and programmed it can be used for many future recording sequences.

In a further method variant in accordance with the invention, several MR signals are recorded and combined, in particular accumulated, and post-correction of the individual MR signals is carried out before combination, in particular before accumulation. The scans are recorded and corrected in accordance with the determined frequency error. Only after this correction are the scans further processed. If e.g. the FIDs are added after correction, the FIDs have a larger area than that obtained by adding uncorrected FIDs.

The area below an FID is a measure of the correction quality. This method is especially useful if real-time correction is not possible, as is e.g. the case when the MR apparatus electronics are inaccessible. It is also feasible to reuse the sum of all corrected FIDs or scans as a reference scan. This is advantageous since correction is further improved due to the improved signal-to-noise ratio. Furthermore, an additional phase correction can follow the frequency correction of the FIDs. In this case as well, the sum of the frequency-corrected FIDs can be used as a reference.

Advantageously, a time dependence of each corresponding phase signal $\phi_i(t_i)$ is determined from the time dependence $s_i(t_i)$ of the associated MR signals, wherein a phase signal or an average value thereof is selected from several phase signals as a reference phase signal $\phi_{ref}(t_i)$, wherein the MR signals are phase-corrected by means of this reference phase signal $\phi_{ref}(t_i)$. Phase correction occurs in addition to frequency correction and each point can be corrected separately.

If the reference phase signal $\phi_{ref}(t_i)$ is determined from an MR signal which differs as little as possible from the neighboring MR signals, a particularly good reference signal is selected since one must assume that the reference signal is selected within a measuring range in which the magnetic field or the frequency changes only slightly.

Phase correction of MR signals is preferably applied in an MR spectroscopy method which does not have magnetic field locking, in particular in an in-vivo spectroscopy method. Correction is possible without intervention in the MR apparatus.

In a further aspect of the invention, the above mentioned object is achieved by an MR apparatus for carrying out the inventive method, comprising a magnet system for producing a magnetic field in a measuring volume, comprising means for irradiating an RF excitation pulse onto a control or sample substance in the measuring volume and producing one or more MR signals, comprising means for phase-sensitive detection of the MR signal or the MR signals, and with a control device for stabilizing the magnetic field having means for detecting the generated MR signal or MR signals and for deriving a correction or controlled variable to correct deviations of the magnetic fields or of the frequency from a predetermined desired value, wherein the control device also comprises a calculating unit for determining and digitizing, from the time dependence $s_i(t_i)$ of a detected MR signal, a time dependence $\Delta\phi_i(t_i)$ of the phase of the MR signal relative to the phase $\phi_{ref}(t_i)$ of a predetermined reference signal $s_{ref}(t_i)$ and for determining one or more correction or controlled variables therefrom.

Such an MR apparatus permits control or correction of the magnetic field or of the frequencies in real time. As a result, data must not be intermittently stored prior to correction, since correction is possible before termination of the measurement. This saves memory space and time.

In a preferred embodiment, the calculation unit may initiate detection of the MR signal of the control substance synchronously with detection of the MR signal of the sample substance as well as digitization of the recorded signals, and readjusts, for each digitization point, the detected MR signal from the sample substance in correspondence with the phase $\Delta\phi_i(t_i)$ while taking into consideration the gyromagnetic ratio between the sample substance and the control substance. This permits later correction of a recorded MR signal of a sample substance using correction variables determined from an MR signal of a control substance recorded synchronously thereto.

In a preferred further development, the calculation unit can use the time dependence $s_i(t_i)$ of the MR signals to determine the time dependence of the respective phase signals $\phi_i(t_i)$, can select such a phase signal or an average value from several such phase signals as a reference phase signal $\phi_{ref}(t_i)$, and can phase-correct the MR signals before accumulation thereof using this reference phase signal $\phi_{ref}(t_i)$. Later correction of the phase in addition to the frequency is thereby possible.

A further development concerns a calculating unit for use in the above-mentioned MR apparatus which permits real-time processing of the data.

Further advantages of the invention can be extracted from the description and the drawing. The features mentioned above and below can be used in accordance with the invention either individually or collectively in any arbitrary combination. The embodiments shown and described are not to be understood as exhaustive enumeration, rather have exemplary character for describing the invention.

The invention is shown in the drawing and is explained in more detail by means of embodiments.

BRIEF DESCRIPTION OF THE DRAWING

FIG. 3a shows a representation of the time dependence of the real part of a real MR signal;

FIG. 8a shows the sum of 500 uncorrected FIDS; and

FIG. 8b shows the sum of 500 frequency-corrected FIDs.

DESCRIPTION OF THE PREFERRED EMBODIMENT

Figure 1:
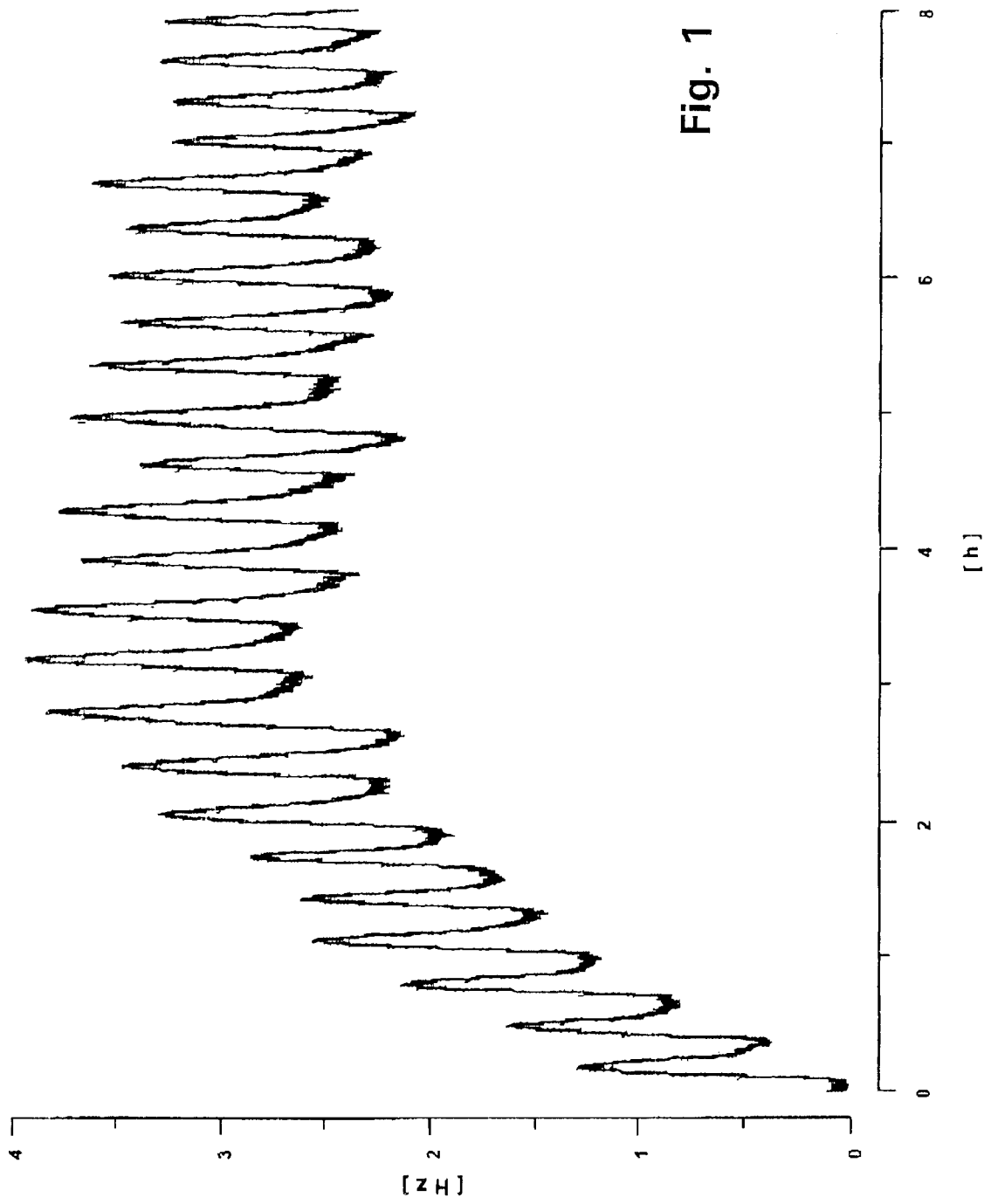
FIG. 1 is an illustration of the change of the magnetic field of an MR apparatus controlled by the inventive method.

FIG. 1 shows the frequency changes of a control substance over a period of 8 hours caused by the change of the magnetic field $B_0$ of a generally highly stable superconducting magnet. The frequency was detected point by point from FIDs using the inventive method. The maximum frequency deviation caused by the magnetic drift during this period was 4 Hz, and determination of the frequency is effected to the noise level, i.e. to approximately 0.05 Hz. This illustrates the quality of the method. In one application of the method, the frequency shift determined with a control substance in this fashion can be used at a later time for frequency correction of the signals of a sample substance. In a further embodiment of the method, either the magnetic field $B_0$ or all frequencies of the system are controlled on-line to a constant value within tolerances of approximately 0.05 Hz and for each detected point in time.

Figure 2:
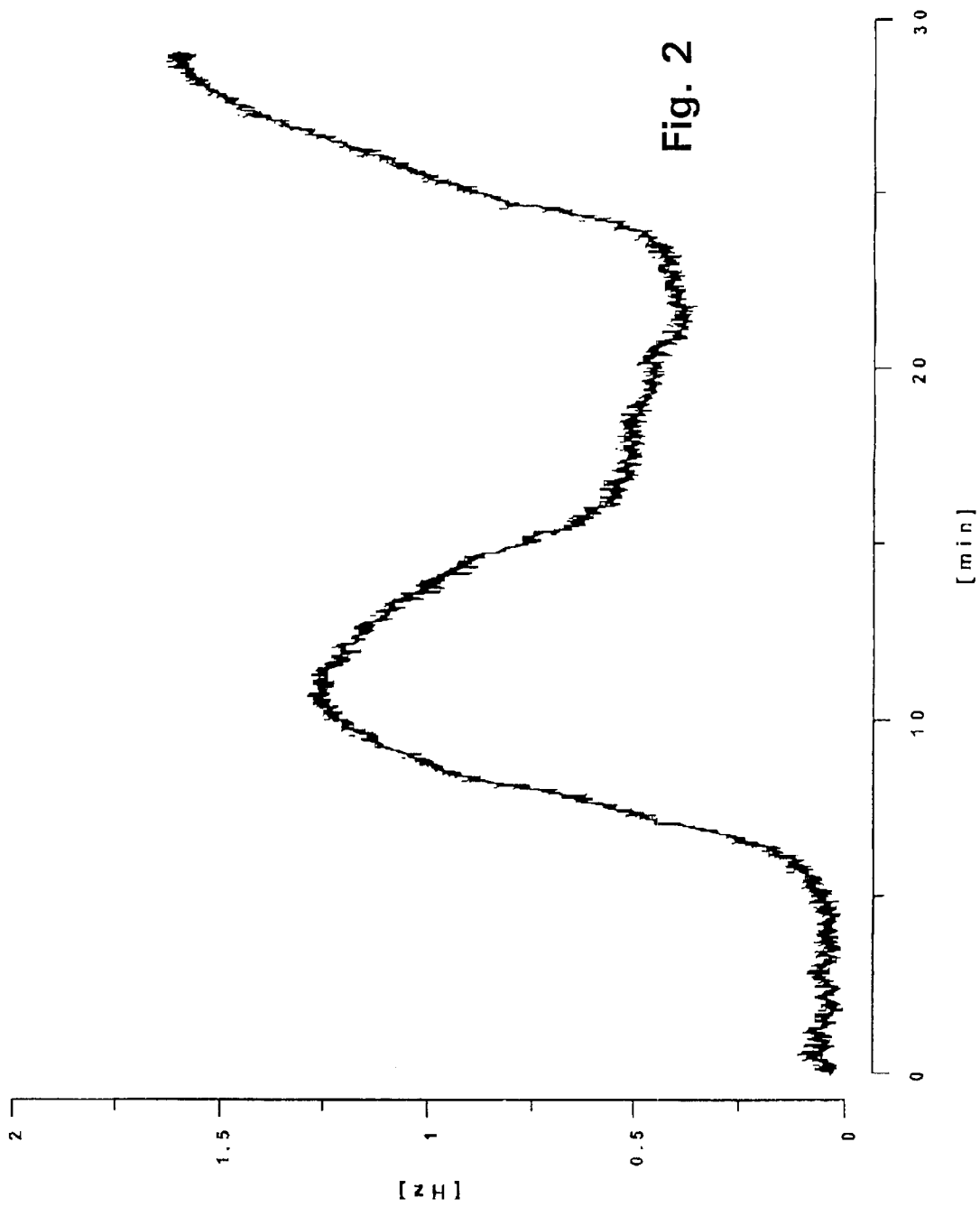
FIG. 2 shows the first 30 minutes of the magnetic field change of FIG. 1.

FIG. 2 shows a section of FIG. 1, namely the first 30 minutes of magnetic field change. The change within the first 30 minutes is less than 2 Hz which is an excellent result. Control of the magnetic field in such a fashion that only small changes in the magnetic field occur over long periods of time considerably facilitates carrying out prolonged experiments.

Figure 3B:
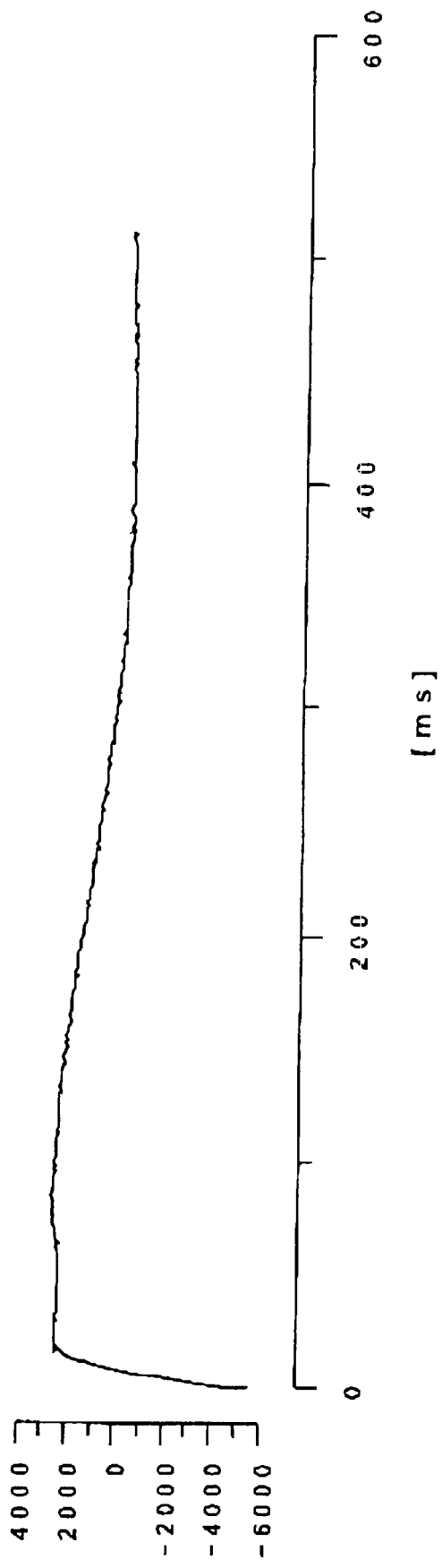
FIG. 3b shows a representation of the time dependence of the imaginary part of a real MR signal.
Figure 4:
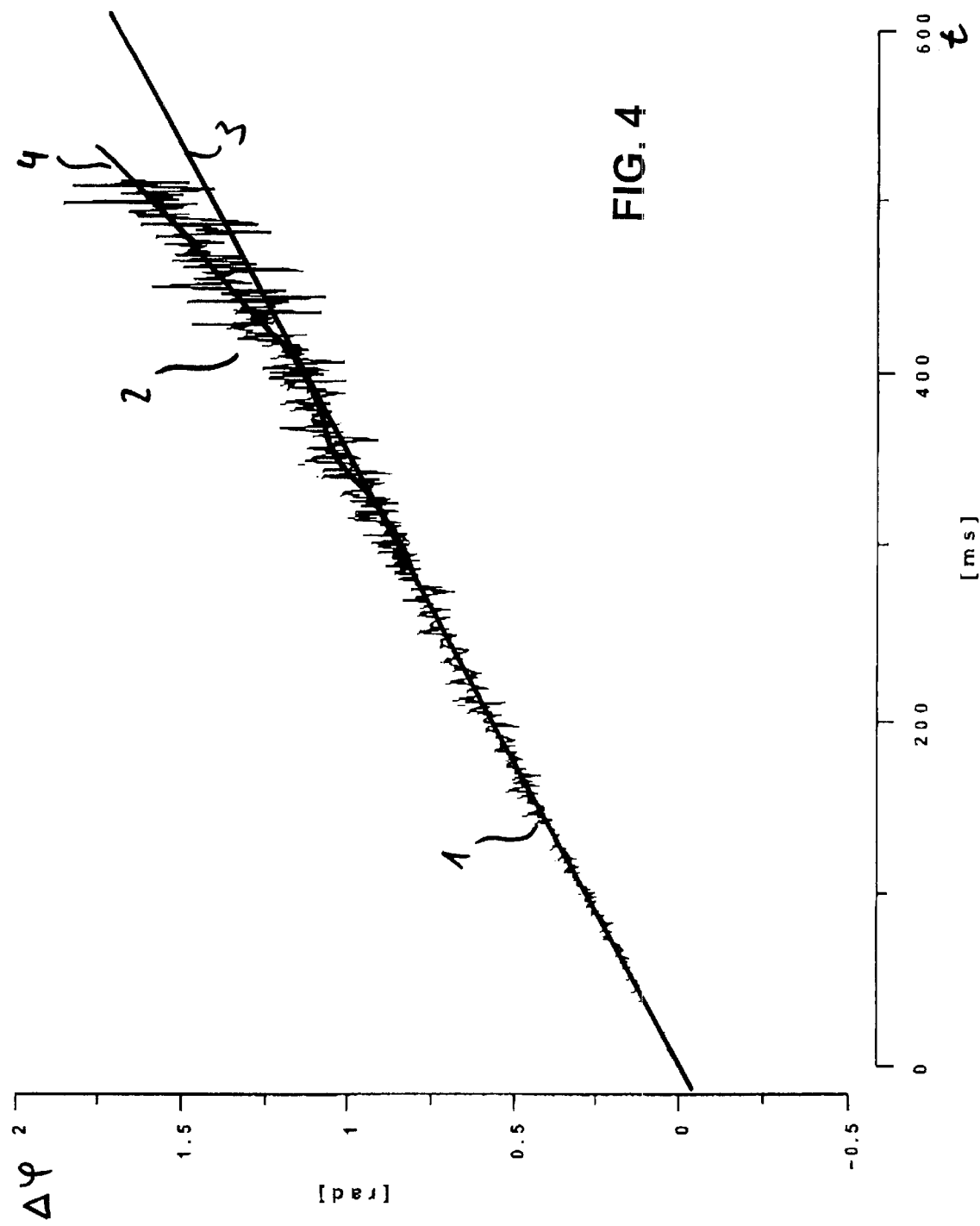
FIG. 4 shows a representation of the time dependence of the phase difference of a measured MR signal relative to the phase of a reference signal.

FIG. 3a shows the digitized real part and FIG. 3b the associated imaginary part of an MR signal as a function of time t. As illustrated in FIG. 4, the measured signal only appears to be in resonance.

FIG. 4 shows the time dependence 1 of the phase difference Δϕ of the measured MR signal of FIG. 3a and FIG. 3b relative to the phase of a reference signal. The reference signal was thereby selected to be an ideal signal. Assuming that an MR signal is infinitely sharp and is present for a long period of time at the output of a quadrature detector of a magnetic resonance (MR) apparatus, the time dependence of the phase of the MR signal is a constant phase having the value 0. Such a signal represents an ideal reference signal. The reference signal can either be measured or pre-calculated. If a magnetic field shift occurs in the MR apparatus, there is also a frequency shift and the measured signal is no longer in resonance. In this case, the phase of the measured signal changes with time relative to the reference signal having the phase 0. This phase difference Δϕ is plotted for each measuring point in FIG. 4.

The variation of the phase difference values Δϕ is small for low t values, but increases for large t values. The noisy behavior 2 of the phase difference Δϕ for large t values is caused by determination of these phase differences for later points in time of an FID, since the amplitude of an FID decreases with time. Assuming constant noise, the signal-to-noise ratio therefore decreases with decreasing amplitude. An approximation for the change of the phase difference with time can be obtained e.g. by approximating the time dependence of Δϕ using a straight line 3. The slope of this line is a measure of the previous frequency deviation from which a controlled or correction variable can be determined.

It is moreover possible to determine the curvature 4 of the time function Δϕ(t) using a polynomial fit method. The determined curvature permits prediction of the probable behavior of the frequency in the immediate future. Selection of a different reference signal instead of one having a phase of 0 is also possible. In this case, one obtains a different position and representation of the phase difference Δϕ(t).

Point by point determination of the phase of an FID of a control substance can be used for point by point phase correction of a sample substance simultaneously measured along with the control substance (in addition to use for integral determination of a frequency deviation).

Figure 5:
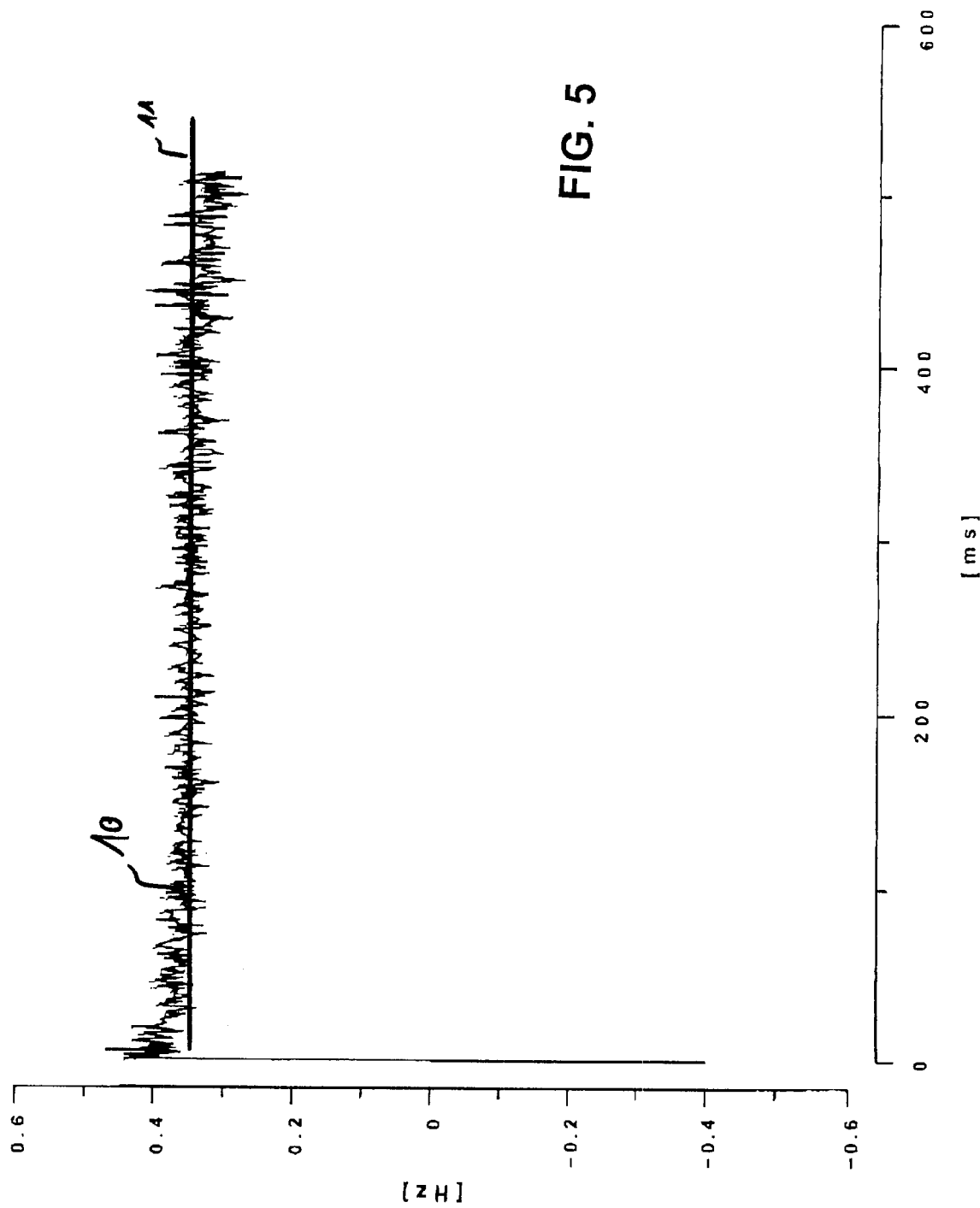
FIG. 5 shows a representation of the time dependence of the frequency deviation determined from the phase difference of FIG. 4.

FIG. 5 shows a representation of the frequency deviation Δf 10 for each measuring point (determined from Δϕ(t)/t of FIG. 4) which is proportional to the magnetic field deviation ΔB via the gyromagnetic ratio. This variable is obtained by dividing the values Δϕ for each measuring point of FIG. 4 by the time t of the respective measuring point. In the idealized case of approximation of Δϕ(t) with a straight line 3, this value is synonymous with the slope of the straight line 3. One thus obtains a value of the frequency deviation Δf. It is also possible to fit a straight line 11 through the frequency deviations 10 or to apply a different smoothing function in case determination of a constant increase was not possible from FIG. 4, in order to determine the correction value(s) and thus to control deviation. The correction values are transmitted to a power supply which controls the current of the lock coil to adjust the magnetic field to the desired value. The determined control deviations permit estimation of the next value of the magnetic field deviation and exact control.

A control signal of a control substance can furthermore be recorded synchronously with the sample signal of a sample substance. A table with phase correction values can be calculated for each data point of the sample signal and the phase correction values may be scaled according to the gyromagnetic ratio between the control signal and sample signal. Correction is carried out afterwards following recording of the control and sample signals. Correction of the frequency and also of the phase is possible.

Figure 6:
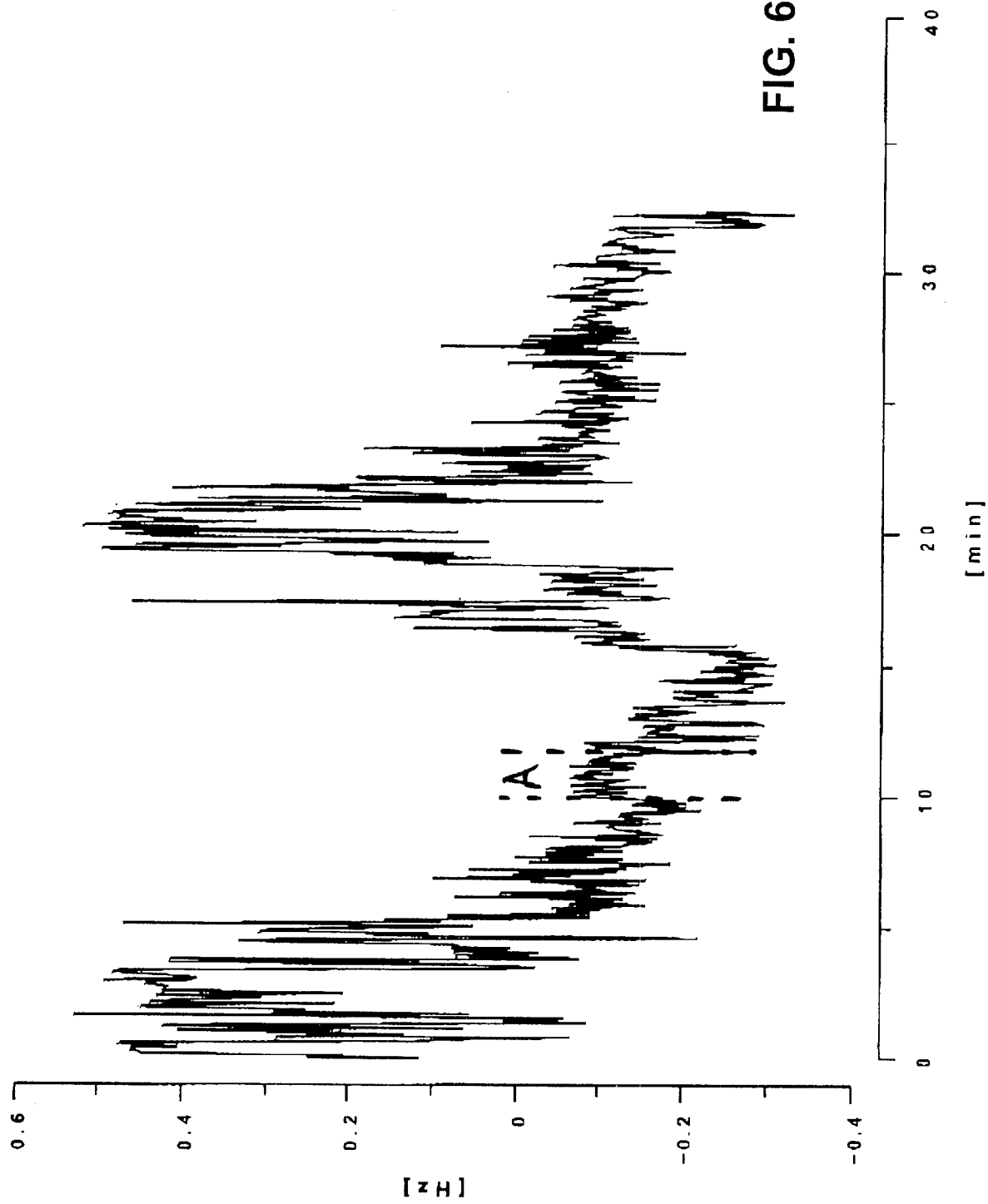
FIG. 6 shows a time variation of the magnetic field $B_0$ of a superconducting magnet which was recorded during the recording time of 500 successive FIDs.

FIG. 6 shows a time variation of the magnetic field $B_0$ of a superconducting magnet which was registered during the recording time of 500 successive FIDs of a sample substance. In the present case, the maximum field deviation is approximately 1 Hz and the first recorded FID is used as a preliminary reference signal. For each subsequent FID, a phase difference Δϕ(t) is recorded. A reference FID is then selected from the region of low frequency and magnetic field changes, e.g. from the region A of FIG. 6 and a phase difference is again calculated with this reference FID. Correction variables are calculated on the basis of these calculated phase differences and the signals are corrected before further processing.

Figure 7:
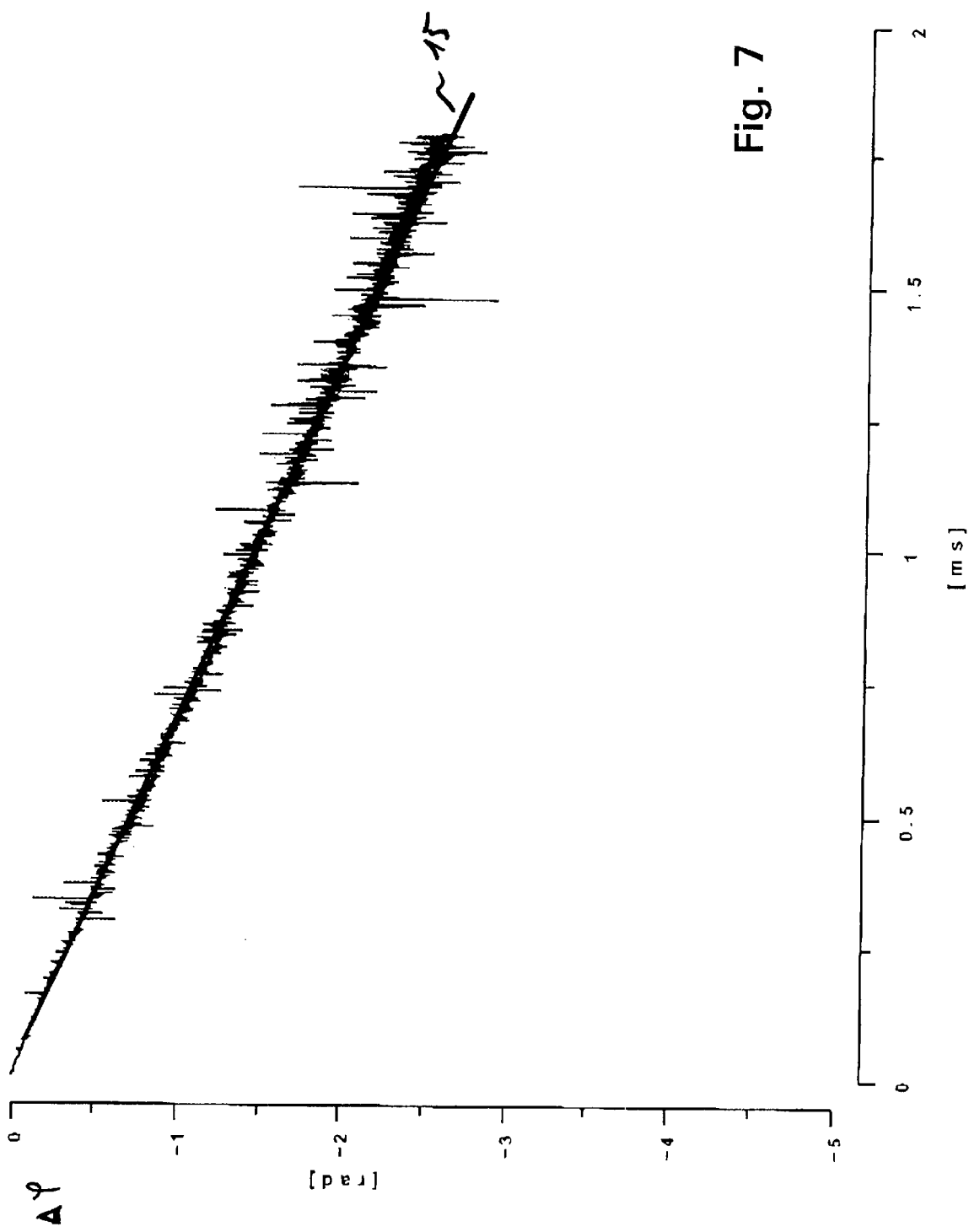
FIG. 7 shows a representation of the time dependence of the phase difference of a measured MR signal relative to the phase of a reference signal.

In accordance with FIG. 7, the correction variables can again be detected by fitting a straight line 15 to obtain as accurate and noise-free correction values as possible.

FIGS. 8a and 8b show the effect of this phase correction before further processing of the signals. FIG. 8a shows the sum of the digitized real parts of 500 recorded FIDs. These FIDs were not corrected before accumulation, resulting in a relatively small area 20 described by the FIDs. In comparison therewith, FIG. 8b shows the sum of the same digitized real parts of the FIDs but with the FIDs being frequency-corrected prior to accumulation. The area 21 described by the sum of the FIDs is larger than that of FIG. 8a. This is particularly evident, since small amplitudes are still visible even at large values of t, which are no longer present in FIG. 8a. The size of the area 20,21 is a measure of the quality of correction, i.e. the larger the area, the better the correction.

In a further iteration, the corrected accumulated FID of FIG. 8b can now be used for additional point-by-point correction of the phase of the 500 previously frequency-corrected FIDs which necessarily results in a further increase in the area of the newly accumulated FID.

I claim:

1. A method for correcting disturbing influences on magnetic resonance (MR) signals of a substance, the method comprising the steps of:
    a) disposing the substance in a measuring volume of an MR apparatus;
    b) irradiating at least one radio frequency (RF) excitation pulse onto the substance;
    c) defining a predetermined reference signal having a predetermined reference phase time dependence within a duration of said reference signal;
    d) detecting and digitizing, in a phase-sensitive fashion, an MR signal emanating from the substance in response to said excitation pulse, said MR signal having an MR signal phase time dependence within a duration of said MR signal;
    e) determining a digitized time dependent phase difference $\Delta\phi_i(t_i)$ between said MR signal phase and said predetermined reference signal phase; and
    f) extracting at least one time dependent correction variable from said phase difference.

2. The method of claim 1, wherein an average increase in said phase difference is determined with the assistance of a linear fit through a corresponding phase difference time function.

3. The method of claim 1, wherein curvature of a phase difference time function is determined and used to predict probable, directly subsequent behavior with respect to deviations from nominal values.

4. The method of claim 3, wherein said curvature of said time function is determined using a polynomial fit method of higher order.

5. The method of claim 1, wherein contributions to said correction variable from individual measuring points of said phase difference at various times are weighted in dependence on a signal-to-noise ratio.

6. The method of claim 1, wherein an RF excitation pulse having a pulse angle of $\alpha<<90°$ is irradiated onto the substance in the measuring volume.

7. The method of claim 1, wherein a frequency of said reference signal is chosen to be different than a desired frequency value and this difference is taken into consideration when determining said correction variable.

8. The method of claim 1, wherein said detected MR signal is subjected to digital filtering.

9. The method of claim 1, wherein said correction variable is used to stabilize a magnetic field in the measuring volume of the MR apparatus by adjusting deviations of the magnetic field from a desired value.

10. The method of claim 1, wherein all signal generating frequencies of the MR apparatus are adjusted using said correction variable.

11. The method of claim 1, wherein steps a) to f) are repeated several times with one frequency deviation $\Delta f_i(t_i)$ being determined as a correction variable for each repetition.

12. The method of claim 11, wherein a time dependence of said frequency deviation $\Delta f_i(t_i)$ is determined for all measuring points at various times $t_i$ using $\Delta f_i(t_i)=[\Delta\phi_i(t_i)-\Delta\phi_i(0)]/t_i$.

13. The method of claim 11, wherein said correction variable is determined as an average value $<\Delta f_i>$ of frequency deviations of all measuring points.

14. The method of claim 1, wherein the substance disposed in the measuring volume of the MR apparatus comprises a sample substance and a control substance.

15. The method of claim 14, wherein, for correcting disturbances during detection and digitization of an MR signal of said sample substance, an MR signal of said control substance is detected and digitized simultaneously with detection of said MR signal of said sample substance, wherein a time dependence of a phase difference $\Delta\phi(t)$ of said MR signal of said control substance, relative to a phase of a predetermined reference signal, is determined from a time dependence of said MR signal of said control substance, and wherein, for each digitization point, said detected MR signal of said sample substance is readjusted in accordance with said phase difference $\Delta\phi(t)$ while taking into consideration a gyromagnetic ratio between said sample substance and said control substance.

16. The method of claim 15, wherein said time dependence of said phase difference $\Delta\phi(t)$ of said detected MR signal of said control substance, relative to said phase of said reference signal, is subjected to a smoothing procedure before readjustment of said MR signal of said sample substance.

17. The method of claim 14, wherein during an MR recording sequence with which magnetic fields are systematically varied with certain magnetic field configurations in the measuring volume being repeated at subsequent points in time, an MR signal of said control substance is excited and detected during occurrence of one or more of these magnetic field configurations in the measuring volume to correct disturbances.

18. The method of claim 1, wherein during an MR recording sequence with which magnetic fields are systematically varied with certain magnetic field configurations in the measuring volume being repeated at similar successive points in time, said MR signal of said substance is detected during occurrence of one or more of these magnetic field configurations in the measuring volume for correcting disturbances.

19. The method of claim 18, wherein said MR recording sequence is sorted in accordance with successive scan regions with comparable properties and corresponding signal points of successive scan regions are compared for correcting disturbances.

20. The method of claim 18, wherein predetermined reference signals are taken from a reference scan.

21. The method of claim 20, wherein said reference scan is selected such that a phase change is as small as possible relative to a preceding and a following scan.

22. The method of claim 20, wherein said reference signals are predetermined and fixedly programmed for a certain MR recording sequence.

23. The method of claim 1, wherein several MR signals are subsequently recorded and combined, wherein a readjustment of individual MR signals is carried out before combining.

24. The method of claim 23, wherein time dependences of phase signals are determined from time dependences of corresponding MR signals, wherein one of a phase signal and an average value thereof is selected from several phase signals as a reference phase signal, and said MR signals are phase-corrected using said reference phase signal.

25. The method of claim 1, wherein said reference phase is obtained from an MR signal which differs as little as possible from neighboring MR signals.

26. The method of claim 1, wherein a phase correction of MR signals is applied in a method of MR spectroscopy not having magnetic field locking.

27. An MR apparatus for correcting disturbing influences on magnetic resonance (MR) signals of a substance, the apparatus comprising:

means for disposing the substance in a measuring volume of an MR apparatus;

means for irradiating at least one radio frequency (RF) excitation pulse onto the substance;

means for defining a predetermined reference signal having a predetermined reference phase time dependence within a duration of said reference signal;

means for detecting and digitizing, in a phase-sensitive fashion, an MR signal emanating from the substance in response to said excitation pulse, said MR signal having an MR signal phase time dependence within a duration of said MR signal;

means for determining a digitized time dependent phase difference $\Delta\phi_i(t_j)$ between said MR signal phase and said predetermined reference signal phase; and means for extracting at least one time dependent correction variable from said phase difference.

28. The MR apparatus of claim 27, comprising:

a magnet system for producing a magnet field in a measuring volume;

means for irradiating an RF excitation pulse onto a least one of a control and sample substance in the measuring volume to generate at least one MR signal;

means for phase-sensitive detection of said MR signal; and a control device for stabilizing the magnetic field, said control device having means for detecting a generated MR signal and for deriving a correction variable to correct deviations of at least one of the magnetic field and a frequency from a predetermined desired value, said control device having a calculating unit which determines and digitizes a time dependence of said phase difference of said MR signal relative to said phase of said predetermined reference signal to determine said at least one correction variable.

29. The MR apparatus of claim 28, for carrying out the method of claim 15, wherein said calculating unit initiates detection of an MR signal of said control substance at a same time as detection of an MR signal of said sample substance as well as digitization of these detected signals and readjusts said detected MR signal of said sample substance for each digitization point in correspondence with said phase difference thereby taking into consideration a gyromagnetic ratio of said sample substance and said control substance.

30. The MR apparatus of claim 28, wherein said calculating unit determines a time dependence of phase signals from a corresponding time dependence of MR signals and selects one of a phase signal and an average value of several phase signals as a reference phase signal to phase-correct the MR signals prior to accumulation thereof.

31. A calculating unit for use in the MR apparatus of claim 28.

* * * * *